US005550730A

United States Patent [19]
Seki

[11] Patent Number: 5,550,730
[45] Date of Patent: Aug. 27, 1996

[54] POWER CONVERTING APPARATUS FOR SYSTEM INTERCONNECTION

[75] Inventor: Nagataka Seki, Tokyo, Japan

[73] Assignee: Kabushiki Kaisha Toshiba, Kawasaki, Japan

[21] Appl. No.: 402,334

[22] Filed: Mar. 10, 1995

[30]  Foreign Application Priority Data

Mar. 11, 1994  [JP]  Japan ................................. 6-040750

[51] Int. Cl.$^6$ ........................ H02M 7/5387; H02M 3/24
[52] U.S. Cl. ............................................. 363/132; 363/98
[58] Field of Search .......................... 363/55–58, 96–98, 363/132, 135, 136

[56]  References Cited

U.S. PATENT DOCUMENTS

| | | | |
|---|---|---|---|
| 4,231,083 | 10/1980 | Matsuda et al. | 363/135 |
| 5,027,263 | 6/1991 | Harada et al. | 363/16 |
| 5,070,426 | 12/1991 | Iwasa et al. | 363/132 |
| 5,077,651 | 12/1991 | Kobayashi et al. | 363/132 |
| 5,260,607 | 11/1993 | Kinbara | 307/253 |

*Primary Examiner*—Matthew V. Nguyen
*Attorney, Agent, or Firm*—Oblon, Spivak, McClelland, Maier & Neustadt

[57]  ABSTRACT

A power converting apparatus for system interconnecting includes a self-commutated converter, DC supply or direct capacitor connected to a DC terminal of the self-commutated converter, a series reactor or transformer, connected between an AC terminal of the self-commutated converter and an AC power system. The self-commutated converter includes a plurality of semiconductor valves connected in bridge between P bus and N bus of the DC supply. The semiconductor valves respectively includes a plurality of series-connected nonlatch devices, a series snubber circuit connected in series to the plurality of series-connected nonlatch devices, and a voltage balancing resistor and a plurality parallel snubber circuits respectively which includes a clipper circuit and a series circuit. The series circuit comprises a snubber capacitor and snubber resistor.

33 Claims, 4 Drawing Sheets

POWER CONVERTING APPARATUS FOR SYSTEM INTERCONNECTION

BACKGROUND OF THE INVENTION

1. Field of Invention

The present invention relates to a power converting apparatus for system interconnection comprising one or more self commutated power converters or inverters (hereafter referred to as "self-commutated converters") for use in direct-current power transmission, frequency conversion, system interconnection, reactive power regulation, and the like.

More particularly the present invention pertains to a power converting apparatus including semiconductor valve structured series-connected or series-parallel-connected nonlatch type semiconductor devices (hereafter referred to as "nonlatch devices"), and is applicable to a large capacity equipment.

2. Description of the Related Art

Ordinarily, a self-commutated converter has a plurality of semiconductor valves connected in bridge connection. The respective semiconductor valves include a plurality of series-connected semiconductor devices, so as to produce a DC output, or an AC output of a desired frequency, by turning on and off the semiconductor devices in an alternate matter. The semiconductor devices can be provided as self-turnoff type semiconductor devices (hereafter referred to as "self turn-off devices") to take the place of thyristors. A self turn-off device is a semiconductor device capable of turning itself off by a gate signal or the like, such as a gate-turn-off thyristor (hereafter referred to as "GTO").

There are some advantages when self turn-off devices are incorporated in a converter as semiconductor devices. For example, the possibility of using GTO in converters has increased in large capacity equipment instead of conventional thyristor in converters.

When self turn-off devices are incorporated in a self-commutated converter which is applied in a general-purpose inverter or uninterruptable power supply system, the frequency of the pulse-duration modulation can be increased to a high-frequency on the order of 10 kHz to 20 kHz. Such apparatus using self turn-off devices can provide substantial improvement of its controlling characteristic.

However, in a case of a system interconnection including self-commutated converters, using GTOs as self turn-off devices, the switching frequency is restricted to about several hundred hertz. Therefore, it is desireable to increase the switching frequency of a self-commutated converter incorporated in a system interconnection to a high-frequency on the order of 10 kHz to 20 kHz, also.

Here, FIG. 7 shows an example of a convention of the structure of a system interconnection using a direct-current-alternating-current (hereafter referred to as "DC-AC") self-commutated converter.

A system interconnection comprises a self-commutated converter 3, a DC power supply 1 connected to a DC terminal of the self-commutated converter 3 through a DC reactor 2, and an AC power system 6 (hereafter referred to as "AC system") connected to an AC terminal of the self-commutated converter 3 through a connect reactor 4 and a transformer 5. The self-commutated converter 3 converts DC power supplied from the DC power system 1 into AC power and supplies the AC power to the AC system 6 through the series reactor 4 and the transformer 5.

However, the self-commutated converter 3 which uses GTOs as self turn-off devices in the system interconnection can have associated therewith problems as described next.

In a system so constructed, it is necessary to provide a snubber circuit which is connected in parallel to the GTO in order to protect the GTO from overvoltage at the time of the turn-off of the GTO. A snubber circuit includes a snubber capacitor and a discharge resistor which is connected in series with the snubber capacitor. The electric charge which is applied between both ends of the GTO charges the snubber capacitor at the time of the turn-off of GTO, and then is discharged through the discharge resistor while the GTO is conductive. Accordingly, most of the energy stored in a snubber capacitor is consumed as heat by the discharge resistor while the GTO is conductive. On the other hand, the handling to the energy has to exclusively rely on the snubber capacitor. In order to absorb the energy by the snubber capacitor, and the turn-off condition of the GTO, the capacitance of the snubber capacitor has to be increased. Also, in the case of a plurality of series-connected GTOs for a large capacitance converter, the capacity of the snubber capacitor has to be increased according to the voltage sharing. However, since the while energy stored in the snubber capacitor is consumed by the discharge resistor, the energy loss increases when the capacitance of the snubber capacitor is increased. As a converter capacity increases, the snubber circuit loss becomes serious. In other words, the efficiency of the self-commutated converter is lowered. This snubber circuit loss becomes very large compared with other circuit losses. Therefore, when GTOs are incorporated in a self-commutated converter, it is difficult to provide for and self-commutated converter for use in a large capacity converter, in view of the undesirable losses caused by the snubber circuit.

Further, immediately after GTO conduction is cut off, the voltage applied between the GTO's anode and cathode increases gradually, and a spike voltage Vsp is generated, as shown in FIG. 8.

The spike voltage Vsp increases with the increase in the anode current. When the spike voltage Vsp increases above a certain level, the GTO may break down. Therefore, it is necessary that the spike voltage Vsp be decreased. Generally, the larger the capacity of the snubber capacitor and the smaller the series inductance of the wiring of the circuit, the more the spike voltage Vsp is decreased. Accordingly, it is necessary that the capacitance of the snubber capacitor is increased. Also, to decrease the spike voltage Vsp, it has been proposed to set a minimum on-time Td, in order to dissipate the electric charge in the snubber capacitor during the on-operation of the GTO. That is, the larger the capacity of the snubber capacitor, the longer the minimum on-time Td becomes. When there is a such limitation in minimum on-time Td, there are some problems as descried next. When switching frequency increase, 1) DC voltage due to increase in order to obtain necessary AC voltage, therefore the voltage harmonic increases 2) and, control response becomes worse so that control impossible time be increased.

In the case of a plurality of series-connected GTOs, if the capacity of the snubber capacitor is decreased, the division of voltage among the respective GTOs (as self turn-off devices) is not uniform. According to the variation of voltage sharing, an overvoltage may be applied to a particular GTO.

As a result, in the case of a self-commutated converter using self turn-off devices for system interconnection, the energy loss increases when the capacitance of the snubber capacitor is increased. On the other hand, if the capacitance of the snubber capacitor is not increased in order to prevent reduction of the efficiency, the voltage sharing applies to each of the self turn-off devices which are connected in series is not uniform. As a result, an overvoltage may be applied to a particular self turn-off device, and the magnitude of the spike voltage Vsp cannot be decreased.

SUMMARY OF THE INVENTION

It is therefore an object of the present invention to provide a power converting apparatus for system interconnection in which the energy loss associated with a snubber capacitor connected in parallel to a semiconductor device are decreased, and a control characteristic is improved, without the limitation of a minimum on-time Td of the semiconductor device.

It is another object of the present invention to provide a power converting apparatus for system interconnection which can reduce harmonics.

In view of the objects and in accordance with the present invention, there is provided, a power converting apparatus comprising a self-commutated converter comprising a plurality of semiconductor valves for bridge connection, a DC supply or a DC capacitor connected to a DC terminal of the self-commutated converter, and a transformer or connect reactor connected between an AC terminal of the self-commutated converter and an AC system, and the each semiconductor valve including a plurality of series-connected nonlatch devices as semiconductor devices, a plurality of parallel snubber circuit connected in parallel to each of the nonlatch devices having a clipper circuit, series snubber circuit connected in series with the plurality of series-connected nonlatch device, and a plurality of voltage balancing resistors connected in parallel to each of the nonlatch devices.

The above-structured a power converting apparatus according to another aspect of the present invention further comprises a common snubber circuit which is connected in parallel to the ends of the plurality of series-connected nonlatch device.

According to further another aspect of the present invention wherein comprises structure of the power supply of the driving circuit of the nonlatch device supplied from energy of main circuit of the semiconductor valve.

Also the present invention is applicable of multiple configuration by a plurality of the self-commutated converters which is respectively connected in one of series, parallel, or series-parallel to a DC power supply.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Preferred embodiments of the present invention will now be described referring to the accompanying drawings.

Figure 1:
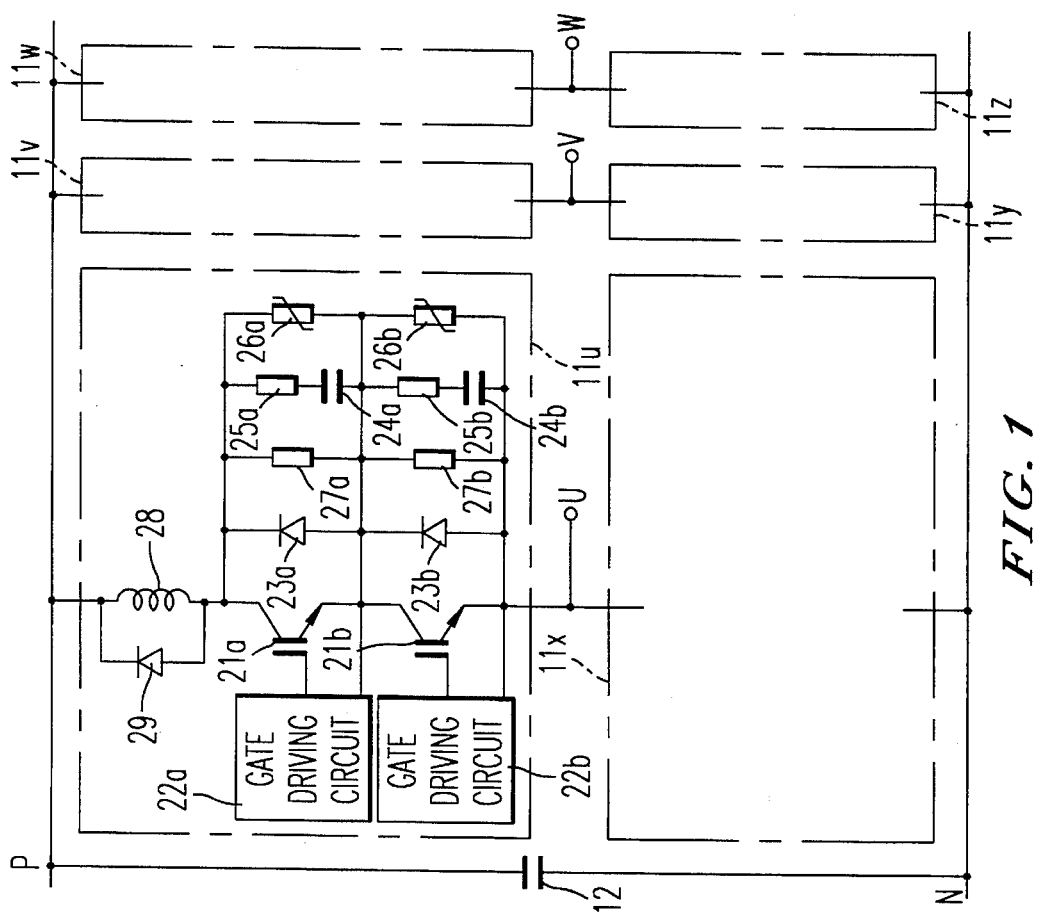

FIG. 1 illustrates a power converting apparatus according to a first embodiment of the present invention.

This figure shows a power converting apparatus provided as a voltage type self-commutated converter. The self-commutated converter includes six semiconductor valves $11u$, $11v$, $11w$, $11x$, $11y$, and $11z$ connected in bridge connection between a positive bus (hereafter referred to as "P bus") and a negative bus (hereafter referred to as "N bus"), and a DC capacitor 12 connected in parallel with the valves between the P bus and the N bus. The symbols u, v, w, x, y, and z shown in FIG. 1 distinguish between phases.

Semiconductor valve $11u$ comprises a switching circuit, a series snubber circuit, parallel snubber circuits, and voltage balancing resistors. The switching circuit comprises two series-connected nonlatch devices $21a$, $21b$ which respectively have gate driving circuits $22a$, $22b$. Feedback diodes $23a$, $23b$ are connected in parallel in the reverse direction to the respective nonlatch devices $21a$ and $21b$. The series snubber circuit comprises a valve reactor 28 and a diode 29 connected in parallel with each other and in series with the series-connected nonlatch devices $21a$ and $21b$, and inserted between nonlatch device $21a$ and the P bus. The parallel snubber circuits respectively comprise a series circuit of snubber capacitors $24a$, $24b$ and snubber resistors $25a$, $25b$ connected in parallel to the respective nonlatch devices $21a$ and $21b$, and nonlinear resistors $26a$, $26b$ connected in parallel to the respective nonlatch devices $21a$ and $21b$. The nonlinear resistors $26a$ and $26b$ serve as clipper circuits. The feedback diodes $23a$ and $23b$ serve as respective unidirectional rectifying elements. The series snubber circuit and the parallel snubber circuit respectively constitute a first means and second means. Voltage balancing resistors $27a$ and $27b$ are connected in parallel to the respective nonlatch devices $21a$ and $21b$. The symbols a and b distinguish the nonlatch devices $21a$ and $21b$ and respective associated circuit elements.

The other semiconductor valves $11v$, $11w$, are constructed the same as the semiconductor valve $11u$. Also semiconductor valves $11x$, $11y$, $11z$ are constructed the same as the semiconductor valve $11u$, but each has a series snubber circuit inserted between the nonlatch devices $21b$ and the N bus.

In addition, while this embodiment is illustrated as having two series-connected nonlatch devices, the present invention can also be practiced with a semiconductor valve comprising more than two nonlatch devices that are series-connected or series-parallel connected.

A representative nonlatch device is a transistor in which on-operation is caused by a gate or base signal (hereafter referred to as a "gate signal"), which flows to the gate or base of the transistor. Also in this device, off-operation is caused by removing the gate signal, or supplying a momentary signal which is the reverse direction to the gate signal. A characteristic of the nonlatch device is that it has a high safe operating region. Namely, the nonlatch device can conduct rated current or current close to rated current while a high voltage is applied to the device.

In contrast, in a latch type semiconductor device such as a thyristor, on-operation is caused by a gate signal, and on-operation continues even if the gate signal is removed. Off-operation of a thyristor is caused by reverse current which flows to the gate.

The parallel snubber circuit plays several roles including (a) reducing the internal loss of semiconductor device, (b) along with the series snubber circuit, improving sharing of the high-voltage applied to series-connected semiconductor devices, (c) absorbing overvoltage caused by series inductance such as inductance of the wiring, and (d) preventing the device from a breakdown caused by a spike voltage Vsp accompanying the switching operation of the semiconductor device.

The use of nonlatch devices 21a, 21b as semiconductor devices of the semiconductor valve which is a component of a self-commutated converter, the circuits of the semiconductor have several features discussed below.

First, a self-commutated converter using a nonlatch device can apply the capacitance of a snubber capacitor and circuit arrangement flexibly. Namely, in this case, the capacitance of the snubber capacitor 24a or 24b can determine a balance of the internal loss of the nonlatch device 21a or 21b and the thermal capacitance of the nonlinear resistor 26a or 26b, respectively. Accordingly, the capacitance of the snubber capacitor 24a, 24b can be smaller than in the case of a self-commutated converter using a GTO, as described above. However, with the capacitance of the snubber capacitor 24 being small, overvoltage during operation is shifted across one or the other of the nonlatch devices. The overvoltage is produced by the difference between the switching timings when the nonlatch devices are turned off. However, this overvoltage is clipped to a safe level by the nonlinear resistor 26a, 26b.

This nonlinear resistor 26 has a resistance which decreases as the voltage applied across it increases above a certain level. On the other hand, in the case of circuit voltage below the certain level, the loss caused by the nonlinear resistor 26a, 26b can be ignored. Also, nonlinear resistor 26a, 26b operates as a clipper which suppresses surge voltages applied to the respective nonlatch devices. In this regard, this clipper function can be performed by a voltage clipper circuit for suppressing voltage which increases more than a certain level, in place of the nonlinear resistor.

Accordingly, the capacitance of the snubber capacitor 24 can be decreased. Therefore, the power loss of the self-commutated converter decreases because the capacitance the snubber capacitor 24 is small.

On the other hand a self-commutated converter using a GTO cannot avoid the restrictions of the capacity of a snubber capacitor and circuit arrangement becaused of the necessity of preventing device breakdown that would be caused by a spike voltage Vsp. Namely, in this case, in a self-commutated convertor using GTOs as semiconductor devices, the capacitance of snubber capacitor is increased in order to provide for the turn-off condition. Here, a GTO is a kind of device that is capable of cutting off a constant current flowing in the GTO, in response to a flow of a negative gate current to the gate of the GTO. Thus, for the turn-off condition described above, the capacitance of the snubber capacitor is increased to some degree, for example 6 μF. In such case, most of the energy of the snubber capacitor is expended through the discharge resistance while the GTO is conductive. Therefore the loss caused by the snubber circuit becomes at least ½ $CV^2$ during one on-off switching operation. (C is the capacitance of the snubber capacitor, and V is the voltage applied to the snubber capacitor.) According to this case, provided that the switching frequency is set at 500 Hz, and V is set to 2.2 kV, the loss of 7.3 kW per a semiconductor device is experienced. In the case that the rated power of a self-commutated converter is 10 MW, this loss caused by the snubber capacitor is 2.2 percent of the rated power. The total, loss of this self-commutated converter will be 5.1 percent of rated power. Accordingly, power loss of the self-commutated converter increases by reason of the snubber capacitors. Also in the case of a self-commutated coverter using a GTO, the capacitance of the snubber capacitor cannot be decreased such as in the case of using a nonlatch device. This is because the electrical characteristic of the GTO corresponding to its safe operating region is limited.

The feature of the valve reactor 28 included in the series snubber circuit is discussed next. A series snubber circuit is a protecting circuit provided for the purpose of decreasing losses when the semiconductor device is turned on. The inductance of the valve reactor 28 included in the series snubber circuit is determined based on the from demand characteristic of the feedback diode 23a, 23b connected in parallel to the nonlatch device 21a, 21b, and the condition of suppressing the high-voltage shifed across one or the other of the series-connected nonlatch devices, along with the parallel snubber circuit. Such high-voltage is produced by the difference of the switching timing when nonlatch devices are turned on. In the case that the semiconductor device is a nonlatch device, the voltage clipper circuit obviates the occurrence of high-voltage. If the reverse recovery current through feedback diode 23a, 23b is small, the inductance of the valve reactor 28 can be decreased. When a semiconductor device is turned off or on, the circulating current flowing through a closed circuit including the valve reactor 28 and the diode 29 has to reduce to "0" until the next switching. If the circulating current does not reduce enough, the snubber capacitor 24a, 24b would begin to charge from the remainder of the circulating current. Thus with circulating current continuing, the voltage applied to the semiconductor device increases immediately after being turn off or on. This in turn would result in application of an undesirably large voltage applied to the semiconductor devices 21a, 21b. However, by using nonlatch devices as the semiconductor devices, this circulating current is also reduced by the nonlinear resistor 26a, 26b. It is therefore possible to provide the valve reactor 28 with a small inductance. Therefore, the construction of the series snubber circuit can be simplified as shown in FIG. 1. Of course, the semiconductor valve which relates to the present invention can use various forms of series snubber circuit.

In accordance with the construction and performance of this embodiment as described above, that is, a self-commutated converter according to the present invention having a nonlatch device as a semiconductor device, and a parallel snubber circuit having a nonlinear resistor, the capacity of the snubber capacitor is small without a limitation caused by the turn-off condition of the semiconductor device, thus reducing the loss caused by parallel snubber circuit as much as possible.

Also in this embodiment, it is possible to avoid the requirement for a minimum on-time Td. Without the requirement of a minimum on-time, there is less limitation on increases the switching frequency. Therefore this embodiment can readily be applied to a high-voltage supply.

Accordingly, this embodiment provides a power converting apparatus for system interconnection, which can increase the switching frequency, and can reduce harmonics.

A second embodiment of the present invention will be described next.

Figure 2:
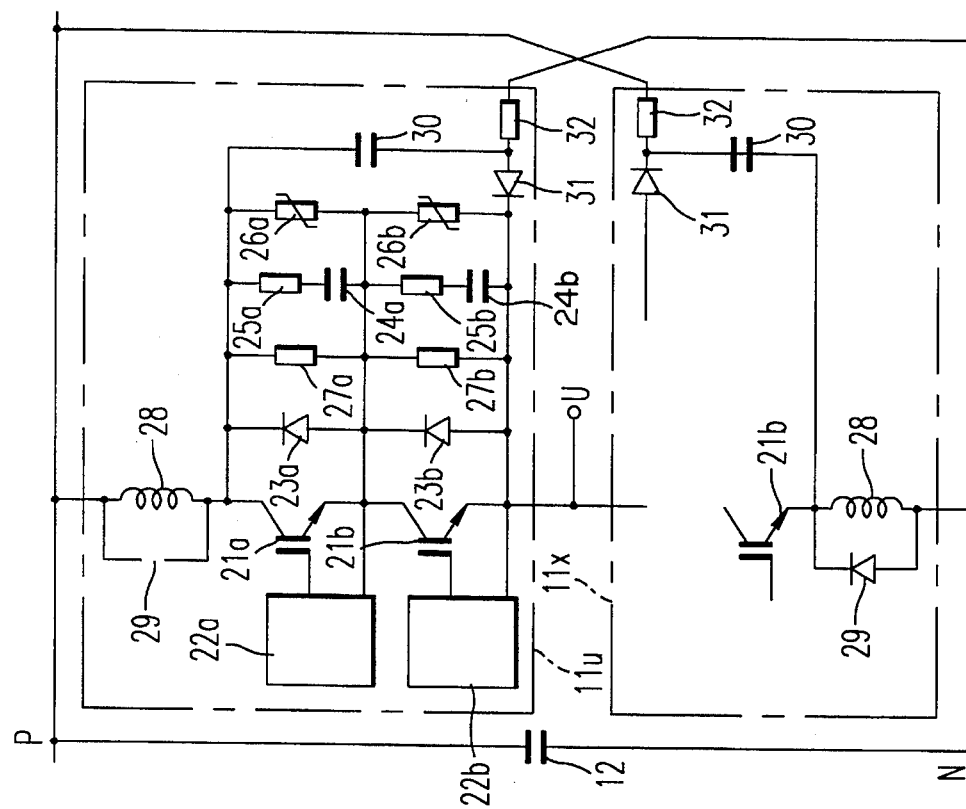
FIG. 1 and FIG. 2 are each a circuit diagram of a self-commutated converter of a power converting apparatus according to the present invention.

FIG. 2 illustrates a circuit diagram of a self-commutated converter according to the second embodiment of the present invention.

The second embodiment differs from the first embodiment in that the parallel snubber circuit is modified. To the extent that structure shown in FIG. 2 is the same as the structure shown in FIG. 1, the same reference numerals are applied.

Semiconductor valve 11u comprises a switching circuit, a series snubber circuit, parallel snubber circuits, voltage balancing resistors. The switching circuit comprises two series-connected nonlatch devices 21a, 21b which respectively the have the gate driving circuits 22a, 22b. The feedback diodes 23a, 23b are connected in parallel in the reverse direction to the respective nonlatch devices 21a and 21b. The series snubber circuit comprises the valve reactor 28 and the diode 29 connected in parallel with each other and in series with the series-connected nonlatch devices 21a and 21b, and inserted between nonlatch device 21a and the P bus. The parallel snubber circuits respectively comprise a series circuit of the snubber capacitors 24a, 24b and the snubber resistors 25a, 25b connected in parallel to the respective nonlatch devices 21a and 21b, and the nonlinear resistors 26a, 26b connected in parallel to the respective nonlatch devices 21a and 21b. The nonlinear resistors 26a, 26b serve as clipper circuits. The feedback diodes 23a, 23b serve as respective undirectional rectifying elements. The series snubber circuit and the parallel snubber circuit construct respectively constitute a first means and a second means. The voltage balancing resistors 27a and 27b are connected in parallel to the respective nonlatch devices 21a and 21b. The other semiconductor valves 11v, 11w although not shown FIG. 2 are expessed as shown in FIG. 1 and are designed the same as the semiconductor valve 11u. Also, semiconductor valves 11x, 11y, 11z are constructed the same as the semiconductor valve 11u, but each has its series snubber circuit inserted between the nonlatch device 21b and the N bus.

A common snubber circuit comprises a general snubber capacitor 30, a common snubber diode 31, and a discharge resistor 32. A series circuit having a common snubber capacitor 30 and a general snubber diode 31 of the semiconductor valve 11u is connected in parallel with the ends of the series-connected nonlatch devices 21a and 21b of semiconductor valve 11u. A series circuit having a common snubber capacitor 30 and a general snubber diode 31 of the semiconductor valve is connected in parallel with both ends of the series-connected nonlatch devices 21a and 21b of semiconductor valve 11x. This series circuit serves as a common circuit.

The discharge resistor 32 of the semiconductor valve 11u has one end connected to the N bus, and the other end connected to the junction between the common snubber capacitor 30 and general snubber diode 31 of the semiconductor valve 11u. Another discharge resistor 32 of the semiconductor valve 11x has one end connected to the P bus, and the other end connected to the junction between the common snubber capacitor 30 and common snubber diode 31 of the semiconductor valve 11x.

The switching circuit, series snubber circuit, parallel snubber circuit, and voltage balancing resistor operate substantiality as described with respect to the first embodiment.

The common snubber capacitor 30 and the general snubber diode 31 are charged to a level which is slightly higher than the ECL value of the DC voltage, ordinarily. At the time of the turn-off of nonlatch device 21a, 21b, the voltage which is generated by energy of the series inductance applies to the nonlatch devices. At the time of the voltage exceeds the ECL value, the common snubber diode 31 is conductive. The common snubber capacitor 30 absorbs the remainder of the energy of the series inductance and suppresses that overvoltage applied to the nonlatch devices 21a, 21b. The charging voltage ECL of the common snubber capacitor 30 is decided by the balancing of the energy flow into the common snubber capacitor 30, the energy dissipated of the discharge resistor 32, and the energy returned the DC supply through this discharge resistor 32. In such case, if the capacitance of the common snubber capacitor 30 is increased, the power loss of the converter will not increase.

According to the second embodiment as described above, it is possible to achieve advantages as follows.

(a) The voltage sharing of the series-connected semiconductor devices need not to determine the capacitance of the snubber capacitor in accordance with the cut-off characteristic of the semiconductor devices. The present invention can guarantee appropriate voltage sharing between the series-connected semiconductor devices with voltage clipper circuit and/or nonlinear resistor.

(b) In accordance with the second embodiment, the power loss experienced in the parallel snubber circuit decreases to a quarter of the value observed in conventional circuit.

(c) Without the requirement of a minimum on-time Td, there is less limitation on increasing the switching frequency. As decrease the minimum on-time Td, it is possible to attempt improvement of the control because of disappearing ineffective time of the control of the converter.

(d) In addition, with an increase of the switching frequency, without the limitation of minimum on-time Td, a ratio of the maximum AC voltage generated from a self-commutated converter to DC voltage is not reduced.

Figure 4:
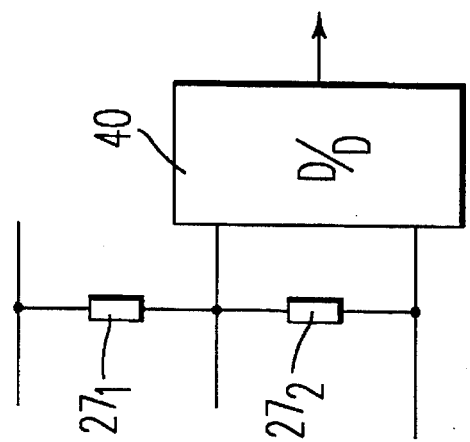
FIG. 4 is a diagram illustrating the structure of a power supply of the gate driving circuit supplied from a voltage balancing circuit.

The present invention be matched using a metal oxide semiconducter (hereafter referred to as MOS) device for a higt voltage application, such as a injection enhancement type MOS transistor (hereafter referred to as IEGT) as a nonlatch device. IEGT was described in a Daily Industry newspaper on Dec. 23, 1993. In the case of applying an MOS device, such as an IEGT to the practice of the present invention, it is effective to provide the power supply of the gate driving circuit from the main circuit of the self-commutated converter. Embodiments for providing the power supply to the gate driving circuit are shown in FIG. 3 and FIG. 4.

Figure 3:
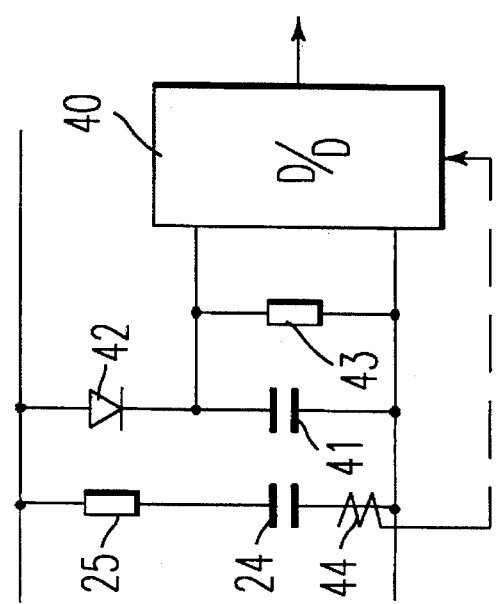
FIG. 3 is a diagram illustrating the structure of a power supply for a gate driving circuit of a semiconductor device of the converter supplied from a parallel snubber circuit.

FIG. 3 shows the structure of the power supply circuit of a gate driving circuit, which has a direct-current-to-direct-current converter (hereafter referred to as "DC-DC converter") connected in parallel to the parallel snubber circuit.

The power supply circuit comprises a DC-DC converter 40, a capacitor 41, a diode 42, and a resistor 43. A series circuit of the diode 42 and the capacitor 41 is connected in parallel to the parallel snubber circuit formed by a capacitor 24 and a resistor 25, and that is in parallel to the associated nonlatch devices 21a or 21b. The resistor 43 is connected in parallel to the capacitor 41. One terminal of the DC-DC converter 40 is connected in parallel with the resistor 43, and the other terminal is connected to the gate driving circuit although not shown FIG. 3 and supplies voltage to the gate driving circuit.

The capacitor 41 is charged when the nonlatch device 21a or 21b is turned off. On the other hand, when the nonlatch device is turned on, the electric charge of the capacitor 41 prevents to discharge through the nonlatch devices 21, according to the diode 42. Namely, the capacitor 41 is charged from the voltage applied between the positive and negative electrodes of the associated nonlatch devices 21a or 21b ordinarily. Further, the capacitor 41 operates as a voltage clipper circuit of the nonlatch device, and also serves as a storage battery. The resistor 43 is a discharge resistor for moderately discharging capacitor 41 so that the voltage on capacitor 41 is not too high.

In accordance with another configuration power supply for the gate driving circuit from snubber energy, it is possible to drive energy from a current transformer 44 which is connected in series to the snubber capacitor 24, as shown in FIG. 3. A circuit (not shown), which is inserted between the current transformer 44 and DC-DC converter 40, converts the current flow from the current transformer 44 into a voltage. The current is produced by the on-off operation of the associated nonlatch device 21a or 21b. The gate driving circuit uses the supplied voltage as the power supply though the DC-DC converter 40.

FIG. 4 shows the structure of a power supply circuit of the gate driving circuit which has the DC-DC converter connected 40 to a divided voltage balancing resistor 27.

The voltage balancing resistor 27a or 27b of FIG. 1 or 2 is divided into a voltage balancing resistor $27_1$ and a voltage balancing resistor $27_2$. The DC-DC converter 40 is connected in parallel to the voltage balancing resistor $27_2$. The DC-DC converter 40 supplies energy from the divided voltage balancing resistor $27_2$ to the gate driving circuit.

Other than above-described, for example, it is possible to construct a power supply circuit having the DC-DC converter 40 connected to the common snubber capacitor 30. Also, it is possible to make use of energy from the series snubber circuit. Also, it is possible to form a combination of these configurations.

In accordance with the embodiments described above, that is, a power converting apparatus according to the present invention getting power for the gate driving circuit of the nonlatch devices from a main circuit of the self-commutated converter, further, it is possible to attempt economy of power energy, and to miniaturize the apparatus.

A third embodiment of the present invention will now described. In this case in which the capacitance of a power converting apparatus is increased, a plurality of self-commutated converters according to the present invention are provided in a multiplexed configuration shown in FIG. 5 and FIG. 6.

Figure 5:
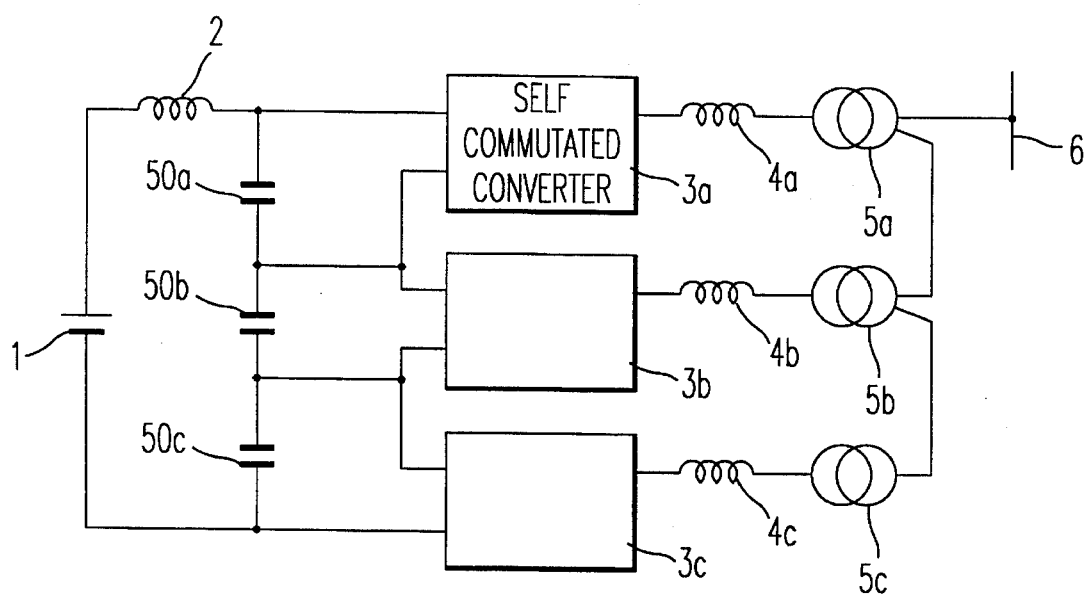
FIG. 5 and FIG. 6 are each a diagram illustrating the structure of a plurality of self-commutated converters connected in a multiplex configuration according to the present invention.

With reference to FIG. 5, a DC reactor 2 is inserted between a DC power supply 1 and the DC terminals of self commutated converters 3A, 3B, 3C. The DC terminals of the self-commutated converters 3A, 3B, 3C are respectively connected in series to the DC supply 1. DC capacitors 50A, 50B, 50C are respectively connected in parallel to the self-commutated converters 3A, 3B, 3C. The self-commutated converter 3A, 3B, 3C are each provided with a construction the same as the self-commutated converter shown in FIG. 1 or FIG. 2. The transformers 5A, 5B, 5C are respectively connected in series to the AC terminals of the self-commutated converters 3A, 3B, 3C through series reactors 4A, 4B, 4C. The line windings of the transformers 5A, 5B, 5C are connected in series in order to compose AC output power from the self-commutated converters 3A, 3B, 3C, and supply the power to AC system 6.

DC reactor 2 and each DC capacitor 50A, 50B, 50C form respective filters. The filters suppress the ripple contained in DC power (supplied from the DC power supply 1) flow to AC system 6. Also the filters suppress the current ripple produced in the self-commutated converters 3A, 3B, 3C that flows to DC power supply 1. Series reactors 4A, 4B, 4C respectively suppress the current which is produced by the difference between the voltage of the AC system and the voltage of the self-commutated converters 3A, 3B, 3C, and decreases the harmonic contained in the AC system 6. The transformers 5A, 5B, 5C isolate the DC power supply 1 from the AC system 6, and match the voltage of the DC power supply 1 and the voltage of the AC system 6.

Figure 6:
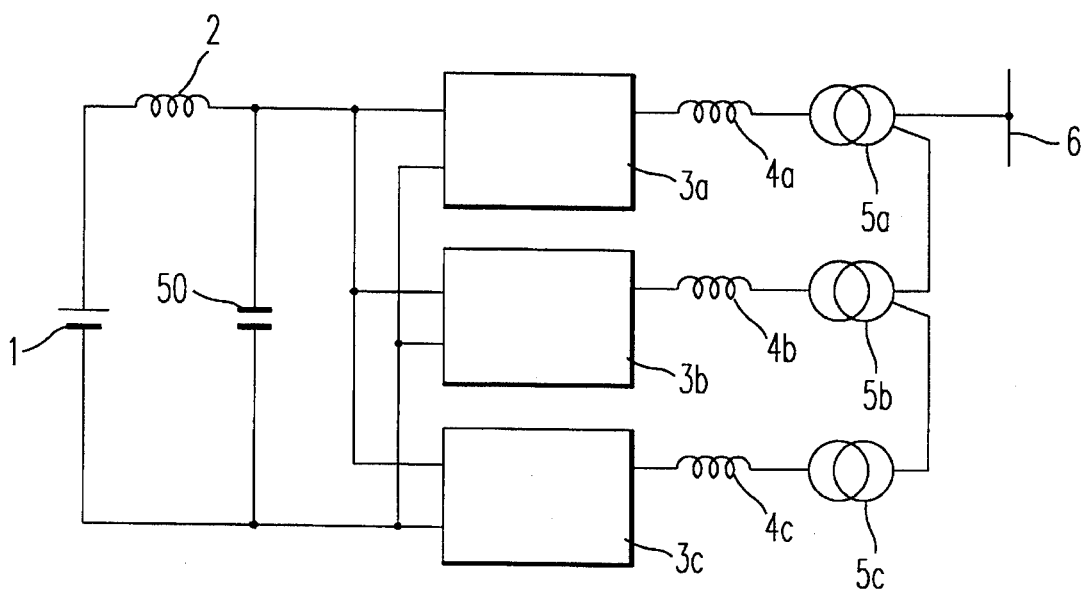
Figure 7:
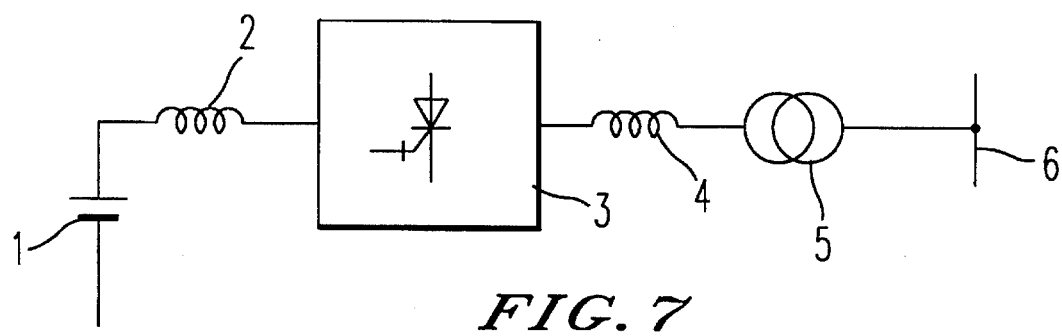
FIG. 7 is a diagram of a conventional system interconnection including power converting apparatus.
Figure 8:
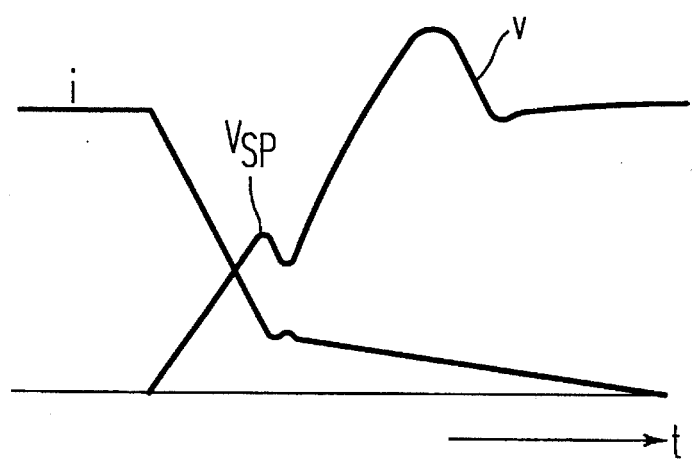
FIG. 8 shows operation waveforms immediately after conduction of GTO elements is cut off.

FIG. 6 shows a configuration in which converters 3A, 3B, 3C are respectively connected in parallel to the DC supply 1 according to another multiplexed embodiment of the present invention.

The DC reactor 2 is inserted between the DC supply 1 and the DC terminals of the self-commutated converters 3A, 3B, 3C. The DC terminals of the self-commutated converters 3A, 3B, 3C are respectively connected in parallel to the DC supply 1. A DC capacitor 50 is connected in parallel to the DC terminal of the self-commutated converters 3A, 3B, 3C. The self-commutated converter 3A, 3B, 3C are each provided with a construction, the same as the self-commutated converter shown in FIG. 1 or FIG. 2. The transformers 5A, 5B, 5C are respectively connected in series to the AC terminals of the self-commutated converters 3A, 3B, 3C through series reactors 4A, 4B, 4C. The line windings of the transformers 5A, 5B, 5C are connected in series in order to compose AC output power from the self-commutated converters 3A, 3B, 3C, and supply the power to AC system 6.

In addition, while the embodiments shown in FIG. 5 and FIG. 6 have been described as having three self-commutated converters connected in series or in parallel, the present invention can be practiced using variations on the multiplexed connection of converters.

In accordance with the embodiments above-described, it is possible to achieve the advantages described above which are realized by using the self-commutated converter according to the present invention. It is therefore possible to reduce harmonics in the composed AC output voltage of FIG. 5 and FIG. 6.

According to these embodiments as described above, in which a plurality of self-commutated converters connected in multipled configuration, the apparatus can reduce harmonics and be used in a large capacity application.

Further, in the case of nonlatch devices, the switching characteristic can be changed by taking into consideration, the gate resistor between the gate driving circuit and gate of the nonlatch device. According to using this switching characteristic, it is possible to more uniformly allocate the voltage between series-connected nonlatch devices. In the case of series-connected nonlatch devices, when the nonlatch devices are turned off, a gate resistor of the one nonlatch device which is applied higher voltage than a gate resistor of the other nonlatch device, is applied to off gate signal slowly or creases its resistivity, relatively.

Further, while the individual embodiments have been described as including DC-AC converters (inverters), the present invention can also be applied to a power converting apparatus comprising AC-DC converters with control circuit non-showed.

What is claimed is:

1. A power converting apparatus for system interconnection, comprising:

self-commutated converter means including a semiconductor value and having a DC terminal for connection to a DC power supply and an AC terminal; and said semiconductor valve comprising switching circuit means including a nonlatch device having a driving circuit, and a unidirectional rectifying element connected in parallel to said nonlatch device, first means connected in series with said nonlatch device, for suppressing voltage when said nonlatch device is turned on, and second means, connected in parallel to said nonlatch device, for suppressing voltage when said nonlatch device is turned off, said second means including a clipper circuit.

2. A power converting apparatus according to claim 1, wherein said first means includes a reactor coupled in series with said nonlatch device and a diode connected in parallel with said reactor.

3. A power converting apparatus according to claim 1 or 2, wherein said second means further includes a series circuit for suppressing overvoltage applied to said nonlatch device.

4. A power converting apparatus according to claim 3, wherein said series circuit comprises:

a capacitor for storing electric charge produced by voltage applied to said nonlatch device when said nonlatch device is turned off; and a resistor for discharging said stored electric charged while said nonlatch device is conductive.

5. A power converting apparatus according to claim 1, wherein said clipper circuit includes a nonlinear resistor for limiting voltage applied to said nonlatch device to a predetermined level.

6. A power converting apparatus according to claim 1, wherein said unidirectional rectifying element includes a diode.

7. A power converting apparatus for system interconnection comprising:

self-commutated converter means including a plurality of semiconductor valves, and having a DC terminal for connection to a DC power supply and an AC terminal;

each said semiconductor valve comprising switching circuit means including a plurality of series-connected nonlatch devices each having a driving circuit, and a plurality of unidirectional rectifying elements respectively connected in parallel to the nonlatch devices, a plurality of voltage allocation means respectively connected in parallel to the nonlatch devices, for applying a uniform voltage to the respective nonlatch devices, first means connected in series with said plurality of series-connected nonlatch devices for suppressing voltage when said plurality of nonlatch devices are turned on, a plurality of second means respectively connected in parallel with said plurality of nonlatch devices, for suppressing voltage when each said nonlatch device is turned off and respectively including a clipper circuit, and common protection circuit means for suppressing overvoltage applied to said plurality of series-connected nonlatch devices and including a common circuit connected in parallel to said plurality of series-connected nonlatch devices and discharging means for discharging an electric charge stored in said common circuit.

8. A power converting apparatus according to claim 7, wherein each of said first means includes a reactor coupled in series with said plurality of nonlatch devices and a diode connected in parallel to said reactor.

9. A power converting apparatus according to claim 7 or 8 wherein the DC power supply includes a positive bus and a negative bus, said plurality of semiconductor valves include one of a positive terminal for connection to the positive bus, and a negative terminal for connection to the negative bus;

one of said first means coupled between the positive terminal of one of said semiconductor valves and said positive bus; and another one of said first means coupled between the negative terminal of another of said semiconductor valves and said negative bus.

10. A power converting apparatus according to claim 7 or 8, wherein said plurality of second means each further includes a series circuit for suppressing overvoltage applied to a corresponding one of said plurality of nonlatch devices.

11. A power converting apparatus according to claim 10, wherein each said series circuit comprises a capacitor for storing electric charge produced by voltage applied to said corresponding nonlatch device when said corresponding nonlatch device is turned off; and a resistor for discharging said stored electric charge while said corresponding nonlatch device is conductive.

12. A power converting apparatus according to claim 7, wherein each said clipper circuit includes a nonlinear resistor for limiting voltage applied to a corresponding one of said plurality of nonlatch devices to a predetermined level.

13. A power converting apparatus according to claim 7, wherein said plurality of unidirectional rectifying elements each includes a diode.

14. A power convening apparatus according to claim 7, wherein said common circuit includes a common capacitor and a common diode in series with the common capacitor.

15. A power converting apparatus according to claim 7, wherein the DC power supply includes a positive bus and a negative bus;

a first one of said plurality of semiconductor valves includes a positive terminal for connection to said positive bus, and a second one of said plurality of semiconductor valves includes a negative terminal for connection to said negative bus;

said discharging means of said first semiconductor valve including a resistor having one end connected to a junction between said general capacitor and general diode associated with said first semiconductor valve and the other end for connection to the negative bus; and said discharging means of said second semiconductor valve including a resistor having one end connected to a junction between said general capacitor and general diode associated with said second semiconductor valve and the other end for connection to the positive bus.

16. A power converting apparatus according to claim 7, further including a power supply circuit;
said power supply circuit including:
voltage supply means including a capacitor for storing a portion of voltage applied to said nonlatch device, and
converter means for converting voltage supplied from said voltage supply means into a driving signal for application to said driving circuit.

17. A power converting apparatus according to claim 7, further including a power supply circuit; and
said power supply circuit including:
current supply means for supplying current induced by current flow in said second means, and
converter means for converting current supplied from said current supply means into a driving signal for application to said driving circuit.

18. A power converting apparatus according to claim 7, wherein each said nonlatch device is a transistor having an MOS gate electrode controlling current flowing in the device.

19. A power converting apparatus according to claim 7, further each said nonlatch device includes a gate; and
a gate resistor respectively connected between said driving circuit and said gate of the nonlatch device.

20. A power converting apparatus for system interconnection, comprising:
a plurality of self-commutated converter means each having DC terminals and an AC terminal, and including a plurality of semiconductor valves;
said DC terminals of the respective self-commutated converter means being respectively connected in one of series, parallel, and series-parallel connection to a DC power supply;
output conditioning means connected to the respective AC terminals of the plurality of self-commutated converter means, for conditioning output power from said self-commutated converter means and for coupling said output power to an AC system; and each said semiconductor valve comprising:
switching circuit means including a plurality of series-connected nonlatch devices each having a driving circuit, and a plurality of unidirectional rectifying elements respectively connected in parallel to the said nonlatch devices,
a plurality of voltage balancing means respectively connected in parallel to the nonlatch devices, for applying a uniform voltage to the respective nonlatch devices,
first means connected in series with said plurality of series-connected nonlatch devices, for suppressing voltage when said plurality of nonlatch devices are turned on,
a plurality of second means respectively connected in parallel with said plurality of nonlatch devices, for suppressing voltage when each said nonlatch device is turned off and respectively including a clipper circuit.

21. A power converting apparatus according to claim 20, further including:
common protection means for suppressing overvoltage applied to said plurality of series-connected nonlatch devices and including a common circuit connected in parallel with said plurality of series-connected nonlatch devices and discharging means for discharging an electric charge stored in said common circuit.

22. A power converting apparatus according to claim 20, wherein said plurality of second means each further includes a series circuit for suppressing overvoltage applied to a corresponding one of said plurality of nonlatch devices.

23. A power converting apparatus according to claim 22, wherein each said series circuit comprises:
a capacitor for storing electric charge produced by voltage applied to said corresponding nonlatch device when said corresponding nonlatch device is turned off; and
a resistor for discharging said stored electric charge while said corresponding nonlatch device is conductive.

24. A power converting apparatus according to claim 20, wherein each said clipper circuit includes a nonlinear resistor for limiting voltage applied to a corresponding one of said plurality of nonlatch devices to a predetermined level.

25. A power converting apparatus according to claim 20, wherein: said plurality of unidirectional rectifying elements each includes a diode.

26. A power converting apparatus according to claim 20, wherein: said output conditioning means includes a plurality of transformers respectively having a primary winding and line winding, and a plurality of reactors respectively connected to said transformers, each of said line windings being connected to one another in series.

27. A power converting apparatus according to claim 20, wherein said output conditioning means includes a plurality of transformers respectively having a primary winding and line winding, and a plurality of respectively connected to said transformers,
each of said plurality of reactors coupled between one of said AC terminals and one of said primary windings, and
each of said line windings being connected to one another in series.

28. A power converting apparatus for system interconnection comprising:
self-commutated converter means including a semiconductor valves, and having a DC terminal for connection to a DC power supply and an AC terminal;
said semiconductor valve comprising
switching circuit means including a plurality of series-connected nonlatch devices each having a driving circuit, and a plurality of unidirectional rectifying elements respectively connected in parallel to the nonlatch devices,
a plurality of voltage balancing means respectively connected in parallel to the nonlatch devices,
first means connected in series with said plurality of series-connected nonlatch devices, for suppressing voltage when said plurality of nonlatch devices are turned on,
a plurality of second means respectively connected in parallel to said plurality of nonlatch devices, for suppressing voltage when each said nonlatch device is turned off and respectively including a clipper circuit.

29. A power converting apparatus according to claim 28, wherein said first means includes a reactor coupled in series with said plurality of nonlatch devices and a diode connected in parallel to said reactor.

30. A power converting apparatus according to claim 28 or 29, wherein said plurality of second means respectively further includes a series circuit for suppressing overvoltage applied to a corresponding one of said plurality of nonlatch devices.

31. A power converting apparatus according to claim 28, wherein each of said series circuit comprises:

a capacitor for storing electric charge produced by voltage applied to said corresponding nonlatch device when said corresponding nonlatch device is turned off; and a resistor for discharging said stored electric charge while said corresponding nonlatch device is conductive.

32. A power converting apparatus according to claim 28, wherein each sail clipper circuit includes a nonlinear resistor for limiting voltage applied to a corresponding one of said plurality of nonlatch devices to a predetermined level.

33. A power converting apparatus according to claim 28, wherein said plurality of unidirectional rectifying elements each includes a diode.

* * * * *